United States Patent [19]

Chamberlin

[11] Patent Number: 5,281,933
[45] Date of Patent: Jan. 25, 1994

[54] LINE POWER TAPPING DEVICE FOR CABLE TV DISTRIBUTION HAVING A MOVEABLE MODULE

[75] Inventor: Robert J. Chamberlin, Manlius, N.Y.

[73] Assignee: North American Philips Corporation, New York, N.Y.

[21] Appl. No.: 784,285

[22] Filed: Oct. 29, 1991

[51] Int. Cl.⁵ .......................... H01P 5/00; H03H 7/46
[52] U.S. Cl. .................................. 333/132; 333/136; 333/260
[58] Field of Search ............... 333/124, 126, 129, 132, 333/136, 245, 260

[56] References Cited

U.S. PATENT DOCUMENTS

| | | | |
|---|---|---|---|
| 2,805,399 | 9/1957 | Leeper | 333/136 |
| 3,881,160 | 4/1975 | Ross | 333/124 |
| 3,895,318 | 7/1975 | Ross | 333/136 |
| 4,394,631 | 7/1983 | Paulic | 333/132 |
| 4,481,641 | 11/1984 | Gable et al. | 333/136 X |
| 4,578,702 | 3/1986 | Campbell, III | 333/136 X |

*Primary Examiner*—Benny Lee
*Attorney, Agent, or Firm*—William L. Botjer

[57] ABSTRACT

A device for tapping the line power of a cable television distribution system. The device is intended for connection to a standard port of a cable tap. The device includes a threaded portion for connection to the port, a housing and an output connector mounted to the housing. Disposed within the housing is a module containing electronics forming a low pass filter to remove the line power from the RF television signal. The module is slidably mounted to extend out of the housing and is biased into engagement with the hot side of the port. The mounting of the electronics within a slidable module permits the low pass filter to be in close proximity to the port so as to eliminate interference with the television signal. The slidable housing also permits the device to be used with ports which differ in depth.

9 Claims, 1 Drawing Sheet

LINE POWER TAPPING DEVICE FOR CABLE TV DISTRIBUTION HAVING A MOVEABLE MODULE

BACKGROUND OF THE INVENTION

This application relates to a compact device for tapping the line power of a cable television distribution system.

Cable television distribution systems include line power on the cable used to distribute the RF TV signals. This power of about 60 volts quasi-square wave is used to power the line amplifiers which are dispersed throughout the system to amplify the TV signals. Generally the line power extends from the head end to the "taps" or boxes which connect one to ten subscribers to the cable line. Such taps are generally passive devices and do not utilize the power on the cable line, they merely remove it from the subscriber's "drop". The taps generally contain "ports" by which the distribution cable enters and exits. The ports are generally ⅜ inch threaded connectors but vary in depth from manufacturer to manufacturer.

Recently, interest has been generated in a new generation of "active" devices mounted at the tap box. Such devices can be scrambling/unscrambling devices or other means to prevent unauthorized cable service. Such devices, of course, require power and a clear choice for powering such device is the cable line power. However, various schemes for utilization of the cable power at the tap has frequently resulted in unacceptable interference and degradation of the RF signal. Degradation of the television signal may effect both the subscribers connected to the tap and those further down the distribution line. The utilization of the line power accordingly has generally been for temporary testing and servicing applications.

Compact line power tapping devices suitable for powering active devices have recently appeared. However, such devices are not sufficiently free of RF interference for many applications as such devices utilize relatively long rods to contact the hot side of the port. Such rods thus can contribute to degradation of the RF signal.

SUMMARY OF THE INVENTION

The present invention is directed to a device for tapping the line power of a cable TV distribution system without adversely affecting the TV signal. Furthermore, the device is designed to be attached to the standard ⅜ inch port of a standard tap. The present device is compact and is designed to couple to ports having different depths. The device includes a threaded portion for connection to the port, a housing and an output connector mounted to the housing. Disposed within the housing is a module containing the electronics of a low pass filter to remove the line power from the RF. The module is slidably mounted to extend out of the housing and is biased into engagement with the seizure screw of the hot side of the port. The mounting of the low-pass electronics within a slidable module permits the low pass filter to be in closest proximity to the port so as to eliminate interference with the television signal. The electronics of the module may optionally include a surge suppression device.

BRIEF DESCRIPTION OF THE DRAWINGS

For better understanding of the invention reference is made to the drawings which are to be taken in conjunction with the detailed specification to follow.

DESCRIPTION OF THE PREFERRED EMBODIMENTS

Figure 1:
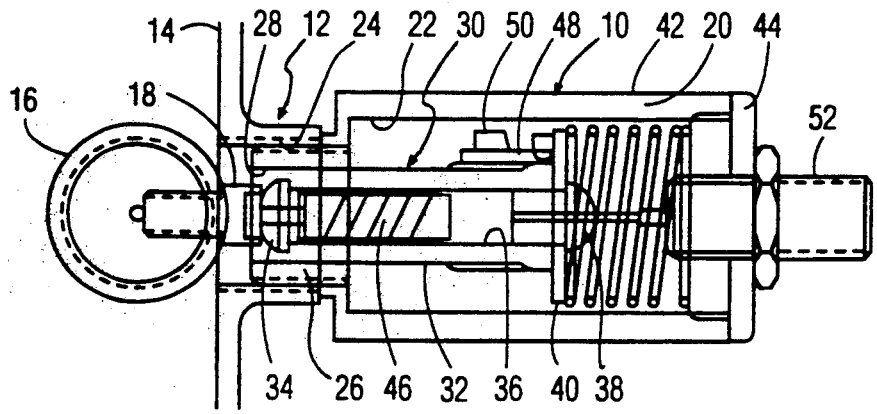
FIG. 1 illustrates the line power tapping device for a cable television distribution system attached to a port of the tap.
Figure 2:
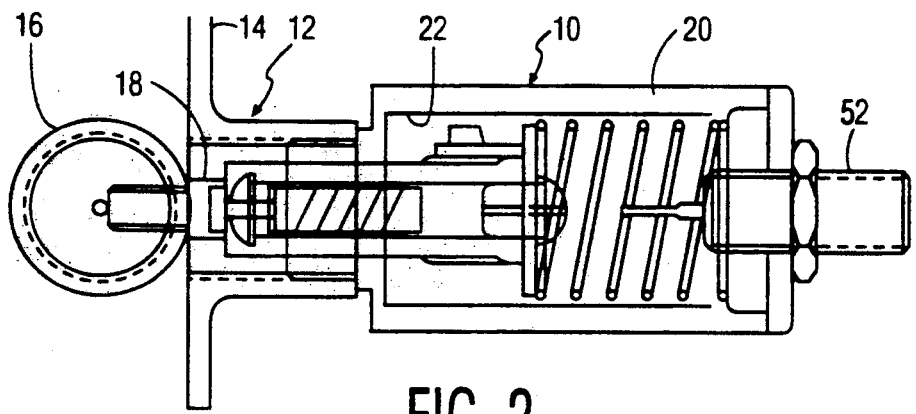
FIG. 2 is an illustration of the inventive line so power tapping device attached to a tap port having a different depth.

FIGS. 1 and 2 illustrates the line power tapping device 10 for attachment to a port 12 of a cable television distribution tap 14. Port 12 connects to a right angle connector 16 for attachment to the cable distribution line. Port 12 includes a seizure screw 18 which carries the hot side of the line power and RF of the television signal, with the threads of port 12 comprising the "ground" side. Tapping device 10 includes an outer housing 20 having a cylindrical opening 22 and threads 24 for connection to the threads of port 12. The forward portion 26 of housing 20 includes a narrowed opening 28. Housing 20 is constructed of conductive material such as metal so that when connected to the threads of port 12 it forms the ground side of device 10 and a "shield" for components mounted within it.

Slidably mounted within outer housing 20 is module 30 which has a forward hollow cylindrical portion 32 which is a slidable fit within opening 28 of forward portion 26 of housing 20 to permit module 30 to slide within housing 20 and to extend forwardly out therefrom. Mounted to the forward end of module 30 is a conductive pin 34 for contact with seizure screw 18 to connect to the "hot" side of the cable distribution system. Module 30 includes a longitudinal cylindrical opening 36 extending from the front to the rear. A rearward conductive pin 38 is used to mount a flange 40 to the rear end of module 30. A spring 42 extends between flange 40 and a metal end cap 44 threaded to the rear of housing 20. Spring 42 serves to bias module 30 forward so that pin 34 is urged into contact with seizure screw 18 of port 12. Module 30 is preferably constructed from insulative material, such as Teflon (polytetraflourethylene) so as to isolate its electrical components from ground. The use of Teflon also assures that module 30 will slide freely out of housing 20.

Figure 3:
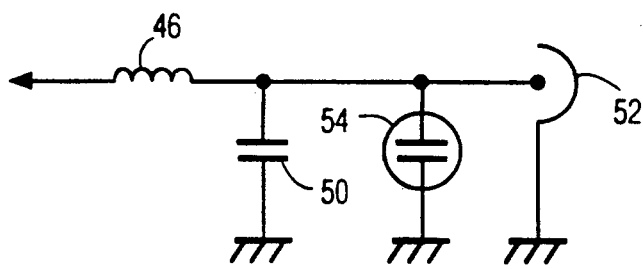
FIG. 3 is a schematic diagram of the electrical components of the line power tapping device.

Module 30 is used to mount the electronic components of the line tapping device 10. Disposed within cylindrical opening 36 of module 30 is a choke 46 and disposed outside of housing 30 is a printed circuit board 48 which may be used to mount a capacitor 50. Choke 46 and capacitor 50 form a "low pass" filter for passing the line power without the RF. The schematic of the electronic circuitry is shown in FIG. 3. Choke 46 is a wire wound ferrite core one end of which is connected to pin 34 (shown in FIG. 1), other end of choke 46 is connected to pin 38 (also shown in FIG. 1) so that it is in series with the hot side of the cable. Capacitor 50 is connected between one end of coil 46 and ground. Choke 46 and capacitor 50 thus form a low pass filter network. Appropriate values for the choke and capacitor, by way of example only, are ten turns of 24 gauge magnet wire wound around a ferrite core with a 0.005 microfarad, 500 volt ceramic capacitor connected between hot and ground. Optionally, a surge suppression device 54 may also be mounted on printed circuit board 48 (not shown in FIGS. 1, 2). Surge suppression device 54 is on printed circuit board 4 connected between the hot side and ground. Surge suppression device 54 may be a miniature gas discharge tube or a solid state device.

As is shown in FIGS. 1 and 2, the placement of the electronic components on slidable module 30 permits the low pass filter circuit to be positioned as closely as possible to the seizure screw 18 of port 12. This greatly minimizes any degradation of RF signals since there is very minimal leakage. Furthermore, since module 30 is slidable the electronic components thereof will always be positioned close to seizure screw 18, regardless of the depth of the port. Mounted to end cap 44 of housing 20 is a standard "F connector" 52 whose center wire is connected to pin 38. F connector 52 is used to connect to the component to be powered by the cable line voltage. An F connector has been chosen merely because it is such a common connector in the cable television systems. However, it should be noted that any other form of connector may also be mounted to end cap 44.

The above described arrangement is merely illustrative of the principles of the present invention. Numerous modifications and adaptations thereof will be readily apparent to those skilled in the art without departing from the spirit and scope of the present invention.

What is claimed is:

1. A device for tapping into the line power of a cable TV distribution system by connection of a port of said device to a tap point of said system, said port having a hot contact and a ground contact, said port passing line power and RF signals from said system into said device, said device comprising:

a housing, said housing including mechanical means for connection to said port, and an output connector;

a module moveably disposed within said housing, contact means for electrical contact with the hot contact of said port said port being disposed at a forward end of said module, said module including electronic means located in close physical proximity to said contact means and electrically connected between said contact means and said output connector for passing the line power from said port through said electronic means to said output connector without passing the RF signals therefrom; and means operatively associated with said device, for mechanically biasing said module and said contact means into engagement with the hot contact of said port.

2. The tapping device as claimed in claim 1, wherein said module is slidably mounted within said housing.

3. The tapping device as claimed in claim 2 wherein said mechanical biasing means comprise spring means in engagement with said housing and said module for urging said slidable module into contact with said port.

4. The tapping device as claimed in claim 1, wherein said electronic means includes a low pass filter.

5. The tapping device as claimed in claim 4, wherein said low pass filter includes a choke connected in series with said hot contact and a capacitor connected between said hot contact and ground.

6. The tapping device as claimed in claim 5, wherein said module comprises insulative material and has a central opening in which said choke is disposed.

7. The tapping device as claimed in claim 1, wherein said housing comprises conductive material and is connected to the ground contact of said port.

8. The tapping device as claimed in claim 1, wherein said output connector comprises an "F" connector.

9. The tapping device as claimed in claim 1 wherein said electronic means includes a power surge suppression device.

* * * * *